United States Patent
Yanagishima

(10) Patent No.: US 7,759,985 B2
(45) Date of Patent: Jul. 20, 2010

(54) DRIVER CIRCUIT AND SEMICONDUCTOR DEVICE USING THE SAME

(75) Inventor: Daiki Yanagishima, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 95 days.

(21) Appl. No.: 12/281,031

(22) PCT Filed: Nov. 30, 2007

(86) PCT No.: PCT/JP2007/073181

§ 371 (c)(1),
(2), (4) Date: Aug. 28, 2008

(87) PCT Pub. No.: WO2008/069129

PCT Pub. Date: Jun. 12, 2008

(65) Prior Publication Data

US 2009/0033405 A1  Feb. 5, 2009

(30) Foreign Application Priority Data

Dec. 6, 2006  (JP) .............................. 2006-329435

(51) Int. Cl.
*H03B 1/00*  (2006.01)
(52) U.S. Cl. ........................ 327/108; 327/112; 327/333
(58) Field of Classification Search ......... 327/108–112, 327/170, 333, 389, 391, 427; 326/22–24, 326/26, 27, 82, 83
See application file for complete search history.

(56) References Cited

U.S. PATENT DOCUMENTS

| 6,275,399 | B1 | 8/2001 | Miyazaki et al. |
| 6,747,502 | B2 * | 6/2004 | Yamamoto ................... 327/333 |
| 7,088,150 | B2 * | 8/2006 | Balhiser et al. .............. 327/108 |
| 2008/0018364 | A1 * | 1/2008 | Clarkin et al. ............... 327/110 |

FOREIGN PATENT DOCUMENTS

| JP | 59-195840 | 12/1984 |
| JP | 11-068534 | 3/1999 |
| JP | 2001-217697 | 8/2001 |

\* cited by examiner

*Primary Examiner*—Long Nguyen
(74) *Attorney, Agent, or Firm*—Fish & Richardson P.C.

(57) ABSTRACT

A driver circuit of the present invention includes: a pair of switch elements (P1, N1) connected in series between a ground terminal and a stepped-up voltage VCP application terminal to which a stepped-up voltage VCP is applied; and a clamp element ZD1 connected between a node A between the pair of switch elements and an output terminal T2, the driver circuit driving, according to a voltage signal derived from the node A, an N-channel output transistor Q1 connected between the output terminal T2 and a power supply voltage VCC application terminal to which a power supply voltage VCC is applied. Here, a current control section (IL1, IL2) formed of a resistor and a capacitor that are connected in parallel with each other is inserted in at least one of a current path that connects the node A and the stepped-up voltage VCP application terminal and a current path that connects the node A and the ground terminal.

8 Claims, 3 Drawing Sheets

DRIVER CIRCUIT AND SEMICONDUCTOR DEVICE USING THE SAME

TECHNICAL FIELD

The present invention relates to a driver circuit for driving an N-channel output transistor and a semiconductor device using such a driver circuit.

BACKGROUND ART

Patent Document 1 listed below discloses and proposes, as an example of conventional art related to a driver circuit for driving an output transistor, a high-voltage driver circuit for giving a high-voltage-swing output signal generated from a low-voltage-swing input signal to next-stage high-voltage operation means, having, as shown in FIG. 3: a high withstand-voltage transistor pair that is formed of a first and a second complementary high withstand-voltage transistors M1 and M2 that are connected in series between two power voltage lines VDD and GND, the control electrode of the second high withstand-voltage transistor M2 being connected to an input terminal Vi, and the node between the first and the second high withstand-voltage transistors M1 and M2 being connected to an output terminal Vo; a capacitor C that is connected between the control electrodes of the high withstand-voltage transistor pair; and voltage limiting means (transistors M3 and M4) that is connected between the power voltage line VDD to which the first high withstand-voltage transistor M1 is connected and the control electrode of the first high withstand-voltage transistor M1 so as to clip the potential of the control electrode.

Patent Document 1: JP-A-H11-68534

DISCLOSURE OF THE INVENTION

Problems to be Solved by the Invention

It is true that, with the above described conventional high voltage driver circuit, it is possible to achieve both high-speed switching and less power consumption at the same time.

However, the above described conventional art is designed exclusively on the premise that a P-channel field-effect transistor is used as the upper side (i.e., the VDD side) high withstand-voltage transistor M1, and thus cannot be applied to a driver circuit for driving an N-channel field effect transistor.

The present invention has been made in view of the above problem, and an object of the present invention is to provide a driver device in which both high-speed switching and less power consumption are compatibly achieved in driving an N-channel output transistor, and a semiconductor device using such a driver device.

Means for Solving the Problem

To achieve the above object, according to one aspect of the present invention, a driver circuit includes: a pair of switch elements connected in series between a ground terminal and a stepped-up voltage application terminal to which is applied a stepped-up voltage that is higher than a power supply voltage; and a clamp element connected between a node between the pair of switch elements and an output terminal, the driver circuit driving, according to a voltage signal derived from the node between the pair of switch elements, an N-channel output transistor connected between the output terminal and a power supply voltage application terminal to which a power supply voltage is applied. Here, a current control section formed by connecting a resistor and a capacitor in parallel with each other is inserted in at least one of a current path between the node between the pair of switch elements and the stepped-up voltage application terminal and a current path between the node between the pair of switch elements and the ground terminal (first configuration).

According to the present invention, it is preferable that the clamp element be a Zener diode (second configuration).

According to the present invention, it is preferable that, in the driver circuit having the above described second configuration, the pair of switch elements consist of a first P-channel field-effect transistor whose source is connected to the stepped-up voltage application terminal, and a first N-channel field-effect transistor whose source is connected to the ground terminal and whose drain is connected to a drain of the first P-channel field-effect transistor (third configuration).

According to the present invention, it is preferable that the driver circuit having the above described third configuration further include: a second P-channel field-effect transistor whose source is connected to the stepped-up voltage application terminal; and a second N-channel field-effect transistor whose source is connected to the output terminal, whose drain is connected to a drain of the second P-channel field-effect transistor, and whose gate is connected to a node between the first P-channel field-effect transistor and the first N-channel field-effect transistor. Here, the driver circuit outputs, as a gate signal of the output transistor, a voltage signal derived from a node between the second P-channel field-effect transistor and the second N-channel field-effect transistor (fourth configuration).

According to another aspect of the present invention, a semiconductor device has the driver circuit having any one of the above configurations 1 to 4 formed as an integrated circuit (fifth configuration).

ADVANTAGES OF THE INVENTION

With the driver circuit of the present invention, it is possible to achieve both high-speed switching and less power consumption at the same time in driving an N-channel output transistor.

LIST OF REFERENCE SYMBOLS

IC1 semiconductor device
P1, P2 P-channel field effect transistors
N1, N2 N-channel field effect transistors
ZD1, ZD2 Zener diodes (clamp elements)
IL1, IL2 current limiting sections
R1, R2 resistors
C1, C2 capacitors
T1 external terminal (upper side gate control terminal)
T2 external terminal (output terminal)

T3 external terminal (lower side gate control terminal)
Q1 N-channel field-effect transistor (upper side output transistor)
Q2 N-channel field-effect transistor (lower side output transistor)
VCC power supply voltage
VCP stepped-up voltage

BEST MODE FOR CARRYING OUT THE INVENTION

Figure 1:
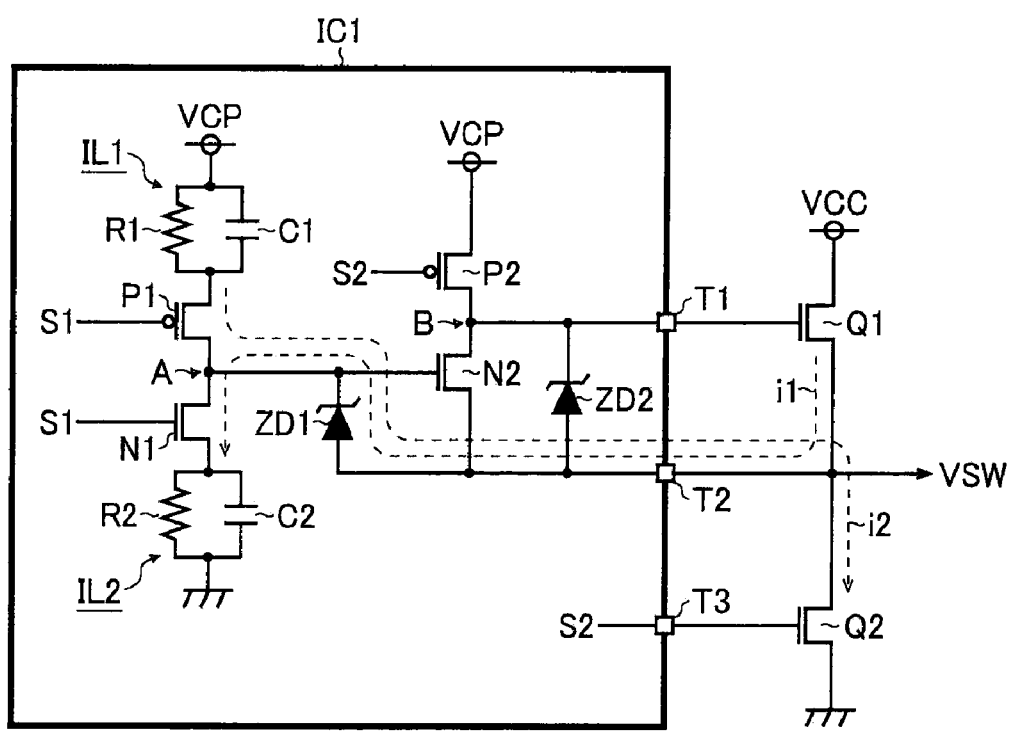
FIG. 1 is a circuit diagram showing a driver device embodying the present invention.

FIG. 1 is circuit diagram showing a driver device embodying the present invention.

A semiconductor device IC1 has a driver circuit of the present invention formed as an integrated circuit, and drives complementary switching of N-channel field-effect transistors Q1 and Q2 (upper-side and lower-side output transistors) connected to external terminals T1 to T3.

It should be understood that the term "complementary" used in this specification covers not only cases where the turning on/off of the transistor Q1 and that of the transistor Q2 take place exactly oppositely to each other but also cases where, from the perspective of preventing a through current, the turning on/off of the transistor Q1 takes place with a predetermined delay relative to that of the transistor Q2.

In the semiconductor device IC1, as components of the driver circuit of the present invention, the following are built into an integrated circuit: P-channel field-effect transistors P1 and P2, N-channel field-effect transistors N1 and N2, Zener diodes ZD1 and ZD2 (clamp elements), and current control sections IL1 and IL2. The current control section IL1 is formed by connecting a resistor R1 and a capacitor C1 in parallel with each other, and the current control section IL2 is formed by connecting a resistor R2 and a capacitor C2 in parallel with each other.

The source of the transistor P1 is connected, via the current control section IL1, to a stepped-up voltage VCP application terminal to which a stepped-up voltage VCP (whose level is, for example, 40 V) is applied. The source of the transistor N1 is, via the current control section IL2, connected to a ground terminal. The drains of the transistors P1 and N1 are connected to each other. The gates of the transistors P1 and N1 are both connected to a control signal S1 application terminal to which a control signal S1 is applied.

The source of the transistor P2 is connected to the stepped-up voltage VCP application terminal. The drain of the transistor P2 is connected to the external terminal T1. The gate of the transistor P2 is connected to a control signal S2 application terminal to which a control signal S2 is applied. The drain of the transistor N2 is connected to the external terminal T1. The source of the transistor N2 is connected to the external terminal T2. The gate of the transistor N2 is connected to a node A between the transistors P1 and N1.

The cathode of the Zener diode ZD1 is connected to the gate of the transistor N2. The anode of the Zener diode ZD1 is connected to the source of the transistor N2. The cathode of the Zener diode ZD2 is connected to the external terminal T1. The anode of the Zener diode ZD2 is connected to the external terminal T2.

The Zener diodes ZD1 and ZD2 described above clamp the gate-source voltages of the transistors N2 and Q1, respectively, at levels (approximately 5 to 10 V) that are lower than their respective withstand voltages (typically, 15 to 20 V).

Outside the semiconductor device IC1, the drain of the transistor Q1 is connected to a power supply voltage VCC application terminal to which a power supply voltage VCC (whose level is, for example, 30 V) is applied. The source of the transistor Q2 is connected to a ground terminal. The source of the transistor Q1 and the drain of the transistor Q2 are connected to each other; their node is connected to a load (not shown) so as to serve as a switch voltage VSW output terminal from which a switch voltage VSW is outputted, and is also connected to the external terminal T2. The gate of the transistor Q1 is connected to the external terminal T1; that is, a voltage signal derived from a node B between the transistors P2 and N2 is fed to the transistor Q1 as its gate signal. The gate of the transistor Q2 is connected to the control signal S2 application terminal via the external terminal T3.

Next, a detailed description will be given of a basic operation of the driver circuit configured as described above.

When the control signal S1 is turned to high level, the transistor P1 is turned off, and the transistor N1 is turned on. Accordingly, the voltage at the node A falls to low level, and the transistor N2 is turned off. On the other hand, when the control signal S2 is turned to low level, the transistor P2 is turned on. Accordingly, the voltage at the node B rises to high level, and the transistor Q1 is turned on. Also, in response to the level of the control signal S2 being turned low, the transistor Q2 is turned off. As a result, the switch voltage VSW that is derived from a node between the transistors Q1 and Q2 rises to high level.

In contrast to the above case, when the control signal S1 is turned to low level, the transistor P1 is turned on, and the transistor N1 is turned off. Accordingly, the voltage at the node A rises to high level, and the transistor N2 is turned on. On the other hand, when the control signal S2 is turned to high level, the transistor P2 is turned off. Accordingly, the voltage level at the node B falls to low level, and the transistor Q1 is turned off. Also, in response to the control signal S2 being turned to high level, the transistor Q2 is turned on. As a result, the switch voltage VSW derived from the node between the transistors Q1 and Q2 falls to low level.

In this way, the driver circuit of this embodiment drives complementary switching of the transistors Q1 and Q2 according to the control signals S1 and S2.

Next, a detailed description will be given of the functions of the current limiting sections IL1 and IL2.

As already described, in the driver circuit of this embodiment, the Zener diodes ZD1 and ZD2 serving as clamp elements are inserted between the gate and the source of the transistor N2 and between the gate and the source of the transistor Q1 so as to protect the gates of the transistors N2 and Q1, respectively. This makes it possible to limit the gate-source voltages of the transistors N2 and Q1 to a level equal to or lower than their respective withstand voltages, but at the same time, a current flows through each of paths i1 and i2 to be wasted, which is inconvenient.

More specifically, when the transistor Q1 is turned on, the transistor N1 is turned on to turn off the transistor N2, and thus a current flows through the path i1 starting from the transistor Q1 to reach the transistor N1 via the Zener diode ZD1, and is wasted. On the other hand, when the transistor Q1 is turned off, the transistor P1 is turned on, and accordingly the voltage level at the node A is turned to high level (which is close to the stepped-up voltage VCP) to turn the transistor N2 on; thus, breakdown of the Zener diode ZD1 takes place, and a current flows through the path i2 starting from the transistor P1 to reach the transistor Q2 via the Zener diode ZD1, and is wasted.

In particular, since the transistors Q1 and Q2 are high withstand-voltage elements, even a small amount of current leakage may lead to a large amount of power loss, and furthermore, may adversely affect the output voltage when this driver circuit is applied to a switching regulator or the like.

To cope with the above described inconveniences, in the driver circuit of this embodiment, the current limiting sections IL1 and IL2 are inserted in the above described paths i1 and i2, respectively.

Figure 2A:
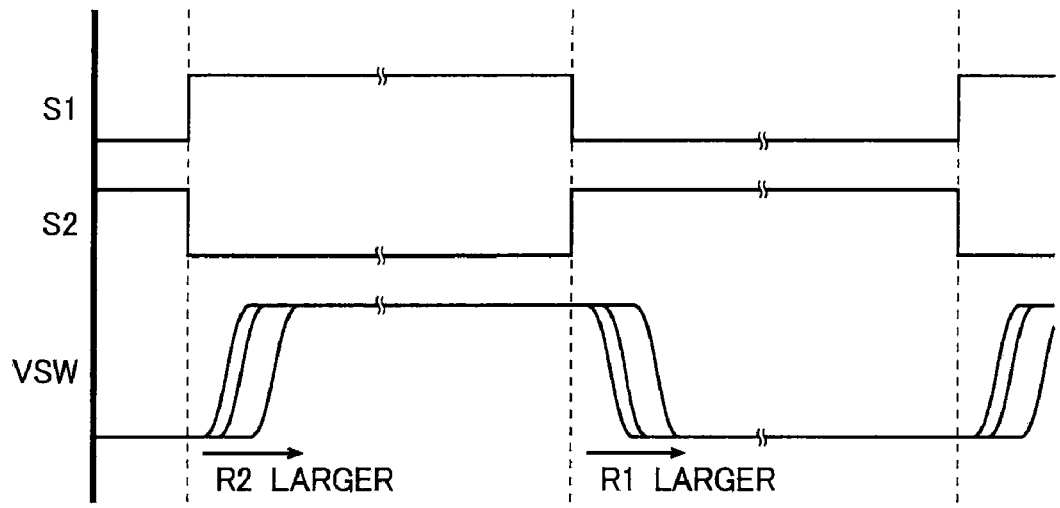
FIG. 2A is a timing chart showing the behavior of a switch voltage VSW in response to control signals S1 and S2 (without capacitors C1 and C2)

In the case where only the resistors R1 and R2 are inserted as the current limiting sections IL1 and IL2, respectively, the higher the resistances are set, the longer it takes to charge/discharge a parasitic capacitor present between the gate and the source of the transistor N2; this slows down the operation of the transistor N2, and accordingly the response of the switch voltage VSW to the control signals S1 and S2 slows down (see FIG. 2A). As has been described, there exists a trade-off relationship between the current limiting capability and the operation speed; if the resistances of the resistors R1 and R2 are set small in order to achieve a higher-speed switching operation, waste of current may not be fully prevented.

Figure 2B:
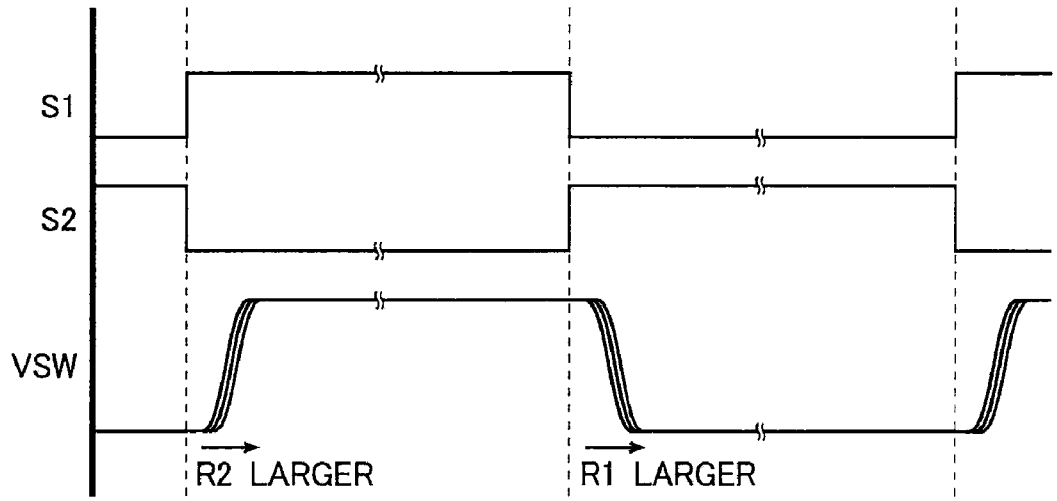
FIG. 2B is a timing chart showing the behavior of the switch voltage VSW in response to the control signals S1 and S2 (with capacitors C1 and C2)
Figure 3:
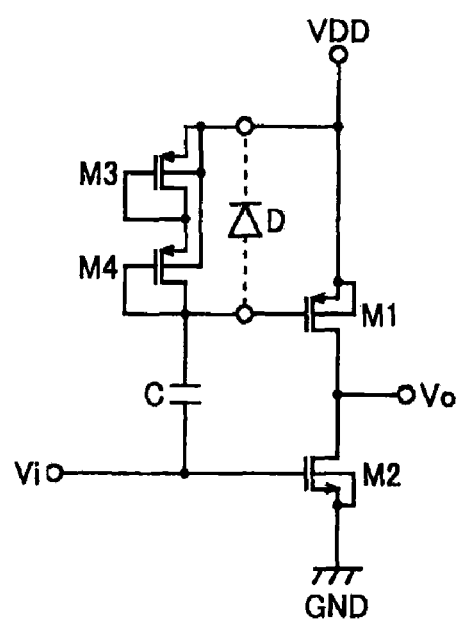
FIG. 3 is a circuit diagram showing an example of a conventional high-voltage driver circuit.

In contrast, the driver circuit of this embodiment is provided with the capacitors C1 and C2 that are connected in parallel to the resistors R1 and R2, respectively. With the capacitors C1 and C2 connected in parallel as described above, a current flows through the capacitors C1 and C2 during a switching period (i.e., when the capacitors C1 and C2 are charged/discharged), while a current flows through the resistors R1 and R2 during a steady period (i.e., after the capacitors C1 and C2 are charged/discharged); thus, the current path in the switching period and that in the steady period can be separated. The effect of the so separated current paths is that, even if the resistances of the resistors R1 and R2 are set high, the high resistances are hardly influential in the switching period, and thus the response of the switch voltage VSW to the control signals S1 and S2 hardly slows down (see FIG. 2B).

Therefore, with the driver circuit of this embodiment, it is possible to achieve both high-speed switching and less power consumption at the same time in driving the N-channel output transistor Q1.

As to the capacitances of the capacitors C1 and C2, they may be appropriately set such that a desired switching speed can be obtained, with the capacitance of the parasitic capacitor present with the transistor N2 and the time constant of the circuit taken into consideration. For example, they may be set at capacitances high enough (approximately 5 pF) to fully charge/discharge the parasitic capacitor present with the transistor N2 (whose capacitance is lower than 1 pF).

As to the resistances of the resistors R1 and R2, they may be appropriately set at resistances high enough (approximately 100 kΩ) to fully prevent the waste of current.

The above embodiment deals with the case where the present invention is applied to a driver circuit for driving a half bridge; however this is not meant to limit the application of the present invention in any way, and the present invention may be applied to a driver circuit for driving a full bridge, or can be applied to a driver circuit for driving a single output transistor constituting a switching regulator or the like.

The present invention may be carried out in any manner other than specifically described above as an embodiment, and permits any variations and modifications within the spirit thereof.

For example, the above embodiment deals with the configuration in which the transistor N2 is driven by the voltage signal derived from the node A and the transistor Q1 is driven by the voltage signal derived from the node B via a buffer stage formed of the transistors P2 and N2, but this is not meant to limit the configuration of the present invention in any way, and the transistor Q1 may be driven directly by the voltage signal derived from the node A, or, more than one of the above described buffer stage may be interposed.

The above embodiment deals with the configuration in which the transistors Q1 and Q2 are externally connected to the semiconductor device IC1, but this is not meant to limit the configuration of the present invention in any way, and the transistor Q1 and Q2 may be incorporated in the semiconductor device IC1. An N-channel transistor is preferable as the transistor Q1, because the element area of an N-channel transistor is about one-third that of a P-channel transistor, which is advantageous in building the transistor Q1 into an integrated circuit.

The above embodiment deals with the configuration in which the current limiting sections IL1 and IL2 are inserted between the transistor P1 and the stepped-up voltage VCP application terminal, and between the transistor N1 and the ground terminal, respectively, but this is not meant to limit the configuration of the present invention in any way, and the current limiting sections IL1 and IL2 may be inserted between the node A and the transistor P1, and between the node A and the transistor N1, respectively, or just one of the current limiting sections IL1 and IL2 may be inserted.

As is apparent from the above description, the technical scope of the present invention covers all the driver circuits that include a pair of switch elements (P1, N1) connected in series between a stepped-up voltage VCP application terminal and a ground terminal, and a clamp element ZD1 connected between a node A between the pair of switch elements and an output terminal T2, that drive an N-channel output transistor Q1 connected between a power supply voltage VCC application terminal and an output terminal T2 according to a voltage signal derived from the node A, and into which are inserted current limiting sections (IL1, IL2) formed by connecting a resistor and a capacitor in parallel to at least one of a current path connecting the node A and the stepped-up voltage VCP application terminal and a current path connecting the node A and a ground terminal.

INDUSTRIAL APPLICABILITY

The present invention offers a technology that is applicable to driver circuits that drive an N-channel output transistor in the field of high-voltage apparatuses such as printers, and that is useful for compatibly achieving both high-speed switching and less power consumption.

What is claimed is:

1. A driver circuit comprising:
   a pair of switch elements connected in series between a ground terminal and a stepped-up voltage application terminal to which is applied a stepped-up voltage that is higher than a power supply voltage; and
   a clamp element connected between a node between the pair of switch elements and an output terminal,
   the driver circuit arranged to drive, according to a voltage signal derived from the node between the pair of switch elements, an N-channel output transistor connected between the output terminal and a power supply voltage application terminal to which the power supply voltage is applied,
   wherein a current control section formed by a resistor and a capacitor in parallel with each other in at least one of a current path between the node between the pair of switch elements and the stepped-up voltage application terminal or a current path between the node between the pair of switch elements and the ground terminal.

2. The driver circuit of claim 1, wherein the clamp element comprises a Zener diode.

3. The driver circuit of claim 2, wherein the pair of switch elements comprises a first P-channel field-effect transistor whose source is connected to the stepped-up voltage application terminal, and a first N-channel field-effect transistor whose source is connected to the ground terminal and whose drain is connected to a drain of the first P-channel field-effect transistor.

4. The driver circuit of claim 3, further comprising:
- a second P-channel field-effect transistor whose source is connected to the stepped-up voltage application terminal; and
- a second N-channel field-effect transistor
  - whose source is connected to the output terminal,
  - whose drain is connected to a drain of the second P-channel field-effect transistor, and
- whose gate is connected to a node between the first P-channel field-effect transistor and the first N-channel field-effect transistor
- wherein the driver circuit is arranged to provide, as a gate signal of the N-channel output transistor, a voltage signal derived from a node between the second P-channel field-effect transistor and the second N-channel field-effect transistor.

5. A semiconductor device comprising a driver circuit according to claim 1, wherein the driver circuit is an integrated circuit.

6. A semiconductor device comprising a driver circuit according to claim 2, wherein the driver circuit is an integrated circuit.

7. A semiconductor device comprising a driver circuit according to claim 3, wherein the driver circuit is an integrated circuit.

8. A semiconductor device comprising a driver circuit according to claim 4, wherein the driver circuit is an integrated circuit.

* * * * *